United States Patent [19]
Chen et al.

[11] Patent Number: 5,880,496
[45] Date of Patent: Mar. 9, 1999

[54] SEMICONDUCTOR HAVING SELF-ALIGNED POLYSILICON ELECTRODE LAYER

[75] Inventors: Min-Liang Chen; Nan-Hsiung Tsai, both of Hsinchu, Taiwan

[73] Assignee: Mosel Vitelic, Inc., Hsinchu, Taiwan

[21] Appl. No.: 892,307

[22] Filed: Jul. 14, 1997

Related U.S. Application Data

[62] Division of Ser. No. 685,757, Jul. 24, 1996, Pat. No. 5,679,595, which is a continuation of Ser. No. 321,352, Oct. 11, 1994, abandoned.

[51] Int. Cl.⁶ .................................................. H01L 27/108
[52] U.S. Cl. ........................ 257/296; 257/303; 257/305; 257/308; 257/311
[58] Field of Search ................................ 257/295, 296, 257/300, 301, 303–309, 311

[56] References Cited

U.S. PATENT DOCUMENTS

| | | | |
|---|---|---|---|
| 4,136,434 | 1/1979 | Thibault et al. | 29/571 |
| 4,261,772 | 4/1981 | Lane | 437/919 |
| 4,413,401 | 11/1983 | Klein et al. | 437/919 |
| 4,419,812 | 12/1983 | Topich | 437/919 |
| 5,006,480 | 4/1991 | Chang et al. | 437/919 |
| 5,006,481 | 4/1991 | Chan et al. | 437/52 |
| 5,061,651 | 10/1991 | Imo | 437/52 |
| 5,120,674 | 6/1992 | Chin et al. | 437/52 |
| 5,137,842 | 8/1992 | Chan et al. | 437/52 |
| 5,198,386 | 3/1993 | Gonzalez | 437/60 |
| 5,210,674 | 5/1993 | Chin et al. | 437/919 |
| 5,223,448 | 6/1993 | Su | 437/52 |
| 5,266,512 | 11/1993 | Kinsch | 437/52 |
| 5,312,769 | 5/1994 | Matsuo | 437/52 |
| 5,326,714 | 7/1994 | Liu et al. | 437/60 |
| 5,364,813 | 11/1994 | Koh | 437/52 |
| 5,429,979 | 7/1995 | Lee et al. | 437/52 |

FOREIGN PATENT DOCUMENTS

| | | | |
|---|---|---|---|
| 0031553 | 2/1983 | Japan | 437/69 |
| 3042164 | 2/1988 | Japan | 437/52 |
| 4-63474 | 2/1992 | Japan | 257/306 |

OTHER PUBLICATIONS

Stanley Wolf Ph.D., *Silicon Processing for the VLSI Era, vol. 2: Process Integration,* 1990, p. 24, Lattice Press.

*Primary Examiner*—Carl Whitehead, Jr.
*Attorney, Agent, or Firm*—Townsend and Townsend and Crew LLP

[57] ABSTRACT

A method and structure for a lower capacitor electrode for a dynamic random access integrated circuit. A polysilicon gate layer is formed over a thin layer of oxide in a first region of a semiconductor substrate. Another oxide layer is then formed overlying the polysilicon gate layer. A polysilicon layer which was doped by S/D implant including the lower capacitor electrode self-aligns and forms overlying a second region of the semiconductor substrate and over the oxide layer on the polysilicon gate layer. A nitride layer forms on the lower capacitor electrode portion overlying the second region. Exposed portions of the polysilicon layer are then oxidized. The S/D was formed by driving dopant from implanted second layer polysilicon. Portions of polysilicon under the nitride layer corresponding to the lower capacitor electrode oxidizes at a slower rate than the exposed portions of the polysilicon. Such sequence of steps forms a self-aligned lower capacitor electrode for a dynamic random access memory integrated circuit.

12 Claims, 6 Drawing Sheets

SEMICONDUCTOR HAVING SELF-ALIGNED POLYSILICON ELECTRODE LAYER

CROSS-REFERENCE TO RELATED APPLICATIONS

This application is a divisional application of U.S. application Ser. No. 08/685,757 filed Jul. 24, 1996, now U.S. Pat. No. 5,679,595 which was a continuation of U.S. application Ser. No. 08/321,352 filed Oct. 11, 1994, now abandoned.

BACKGROUND OF THE INVENTION

The present invention relates to semiconductor integrated circuits and their manufacture. The invention is illustrated in an example with regard to the manufacture of a storage cell capacitor for a dynamic random access memory (DRAM) integrated circuit, but it will be recognized that the invention has a wider range of applicability. Merely by way of example, the invention may be applied in the manufacture of other semiconductor devices such as local interconnection for SRAM, among others.

Capacitors and metal oxide field effect (MOS) transistors and their manufacture are generally known in the art. In the fabrication of a DRAM integrated circuit, it is necessary to fabricate a DRAM cell which includes the MOS transistor and a storage cell capacitor. Examples of DRAM cells include the single poly/diffused bit line cell and double poly diffused bit line cell structures. These cell structures are often not compatible in the manufacture of present DRAM integrated circuits having smaller line widths and greater memory capacity.

In the single poly/diffused bit line DRAM cell structure, each cell includes a field effect transistor (FET) that is adjacent to a storage cell capacitor, thereby providing a substantially linear configuration on the semiconductor substrate. This cell structure typically occupies a larger region which often limits the amount of cells that can be fabricated onto the substrate. Accordingly, the single poly/diffused bit line cells are often not desirable when forming a densely packed structure typically needed for the higher memory DRAM integrated circuits.

Other cell structures such as the double poly/diffused bit line cell are also limiting for the higher memory DRAM integrated circuits. Though such cell may form a densely packed unit for each DRAM device, other limitations often exist, typically lower capacitance of the storage cell capacitor and undesirable capacitance variations among different lines of the DRAM cells.

Further problems may occur during the manufacture of higher memory DRAM integrated circuits by use of the above-mentioned cell structures. For example, as line widths become smaller in the DRAM integrated circuit, mask alignment often becomes more difficult to perform accurately, especially at a critical masking step. This is likely to cause misalignment which often decreases the yield of the integrated circuit devices on a typical semiconductor wafer. Accordingly, it is often desirable to reduce the number of critical masking steps or provide a process that has self-aligning steps.

In addition, multiple implanting steps, especially for high-dose arsenic implants, of the source/drain regions of the field effect devices in both the core region and peripheral region are likely to create more damage to shallower diffusions of semiconductor in the denser DRAM cells. Such damage to the semiconductor often creates current leakage of the core memory area, among other related problems, thereby decreasing the reliability and performance of the particular semiconductor integrated circuit. In a conventional DRAM integrated circuit, at least three separate implanting steps of separate source/drain regions are performed, typically increasing the damage to the semiconductor in the core memory region.

Further, the increased device complexity of the higher memory DRAM integrated circuits often creates more process steps. More process steps are likely to increase the possibility of introducing defects into the device, typically caused by particles, operator handling, and the like. More process steps also tend to promote a longer product turn-around-time (TAT), typically defined as the time from wafer start to final test for the manufacture of the DRAM integrated circuit. The longer TAT is also likely to create higher costs in the manufacture of the integrated circuit.

Still further, it is often desirable to manufacture devices with features therein for easy identification. Competition in the semiconductor industry creates a need for identifying products for the purpose of infringement. Piracy of semiconductor designs also continues to increase as world-wide demand for semiconductor chips grows. However, it is often difficult to determine whether a competitor's chip actually infringes a patented process or has been pirated without extensive investigation, that is, reverse engineering and very detailed analysis by experts. Accordingly, it is desirable to manufacture a semiconductor chip with features therein for easy identification.

From the above it is seen that a method of fabricating semiconductor devices that is easy, reliable, cost effective, and identifiable is often desired.

SUMMARY OF THE INVENTION

The present invention provides a self-aligned electrode for an integrated circuit and its method of fabrication. In particular, the present invention provides a DRAM integrated circuit having a self-aligned lower capacitor electrode. The present capacitor electrode self-aligns onto a portion of a DRAM cell, and eliminates an often critical intermediate masking step which is difficult to align accurately.

In a specific embodiment, the present invention provides a method of forming a semiconductor device having a self-aligned electrode. The method includes providing a semiconductor substrate having a first region and second region, and then forming a first polysilicon layer over the first region. The first polysilicon layer includes an edge at an intersection of the first region and second region. The method further includes forming a first oxide layer overlying the first polysilicon layer, and forming a second polysilicon layer overlying the second region and over the first polysilicon layer. A nitride layer is then formed over a portion of the second polysilicon layer overlying the second region. An oxide layer is then formed from the conversion of the portion of the second polysilicon layer over the first region. The second polysilicon layer portion over the first region oxidizes at substantially a faster rate than the polysilicon layer portion overlying the second region.

In a modification to the preceding embodiment, a second oxide layer is formed overlying the second polysilicon layer often removing the nitride layer. The second oxide layer forms, for example, a capacitor dielectric. Such capacitor dielectric may be a portion of a DRAM integrated circuit memory cell. As a capacitor dielectric, the second oxide layer is typically a thin layer of oxide or an oxide/nitride sandwich. A third polysilicon layer (or upper capacitor electrode) is then formed overlying the second oxide layer. The completed structure includes metallization and surface passivation.

A further modification includes the first oxide layer comprising a cap oxide layer and sidewall spacers. The cap oxide layer is formed on top of the first polysilicon layer (or gate polysilicon layer) and sidewall spacers are formed on the edges of the gate polysilicon layer. A method of forming sidewall spacers includes forming an oxide layer, or generally a dielectric layer, on the top and edges of the gate polysilicon layer and portions of the second region. The oxide layer is then densified and anisotropically etched using reactive ion etching or plasma etching to remove substantial portions of the oxide layer overlying the second region and leaving the sidewall spacers. Optionally, such etching step may leave a thin horizontal portion of the oxide layer overlying the second region.

In an alternative embodiment, the present invention provides a semiconductor device having a self-aligned polysilicon electrode layer. The present semiconductor device includes a first region and a second region where a first polysilicon layer is over the first region. The first polysilicon layer (or gate polysilicon layer) includes an edge at an intersection of the first region and second region. The semiconductor device also includes a first oxide layer overlying the first polysilicon layer, and a second polysilicon layer (or lower capacitor electrode) overlying the second region and a portion of the first region. The first oxide layer seals or isolates the first polysilicon layer from the second polysilicon layer. The self-aligned polysilicon electrode layer eliminates an often critical masking step (memory cell contact opening mask), typically difficult to align for higher memory products.

In a modification to the preceding embodiment, a dielectric layer is overlying the second polysilicon layer over the second region. Such dielectric layer forms, for example, a capacitor dielectric. A second oxide layer formed by the conversion of polysilicon which was over the first region is overlying a portion of the first oxide layer. The second polysilicon layer and second oxide layer intersect over the first region. A birds beak-type structure of the second oxide layer forms at the intersection of the second polysilicon layer and second oxide layer. Of course, the birds beak-type structure provides for the easy identification of the structure according to the present invention. A third polysilicon layer (or upper capacitor electrode) is defined overlying the dielectric layer. The second polysilicon layer, dielectric layer, and third polysilicon layer define a capacitor structure for a DRAM integrated circuit memory cell. The completed structure includes metallization and surface passivation.

A further modification to the preceding embodiment includes the first oxide layer comprising a cap oxide layer and sidewall oxide. The cap oxide layer forms on top of the first polysilicon layer. Sidewall oxide forms on the first polysilicon layer edges. The cap oxide layer and sidewalls seals or isolates the first polysilicon layer from the second polysilicon layer.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Prior Art DRAM Structure

Figure 1:
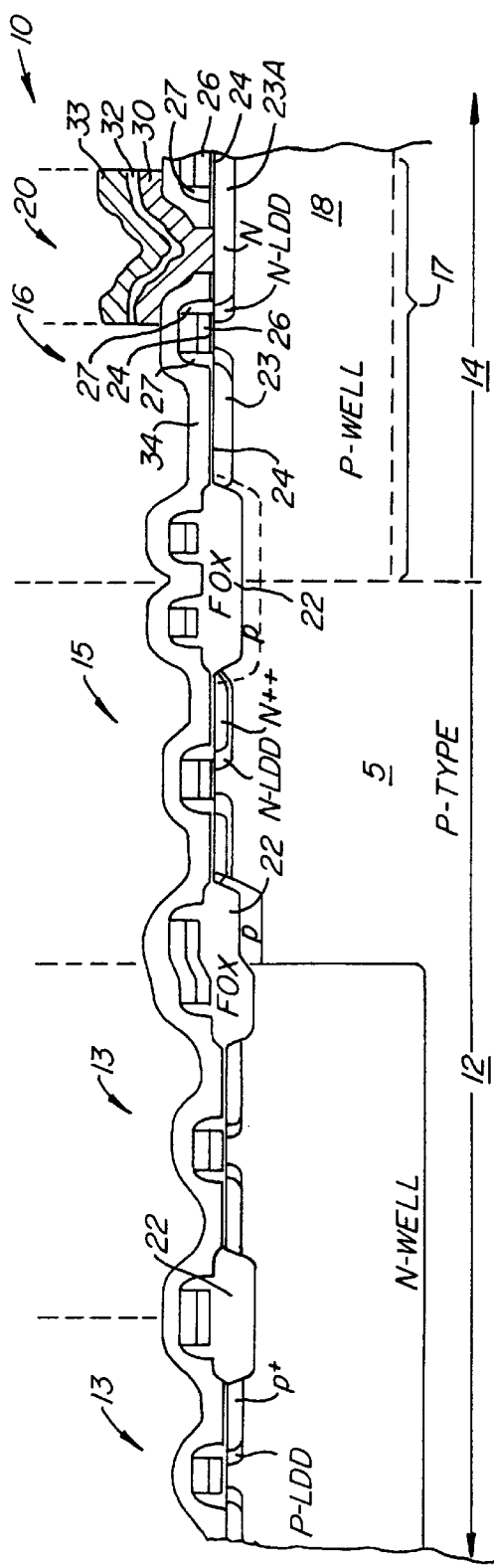
FIG. 1. is a cross-sectional view of a typical prior art device.

FIG. 1 illustrates a cross-sectional view of a portion 10 of a conventional DRAM integrated circuit. A peripheral region 12 and core memory region 14 are defined in a P-type semiconductor substrate 5 of the DRAM integrated circuit. The peripheral region 12 includes P-type channel FETs 13 and an N-type channel FET 15. In the core memory region 14, a conventional DRAM cell 17 is defined. The DRAM cell 17 includes a field effect transistor 16 and a capacitor region 20. The peripheral region FETs (P-type and N-type) and core memory region FETs often have at least three separate source/drain region implants.

Each DRAM cell corresponds to an active region for storing a bit of information for the DRAM semiconductor chip. Thousands and even millions of these microscopically small regions, each defining an active cell, make up a core memory area (or active cell area) of the DRAM integrated circuit chip.

The FET 16 for the conventional DRAM cell is typically an N-type channel device. The N-type channel device is defined within a P-type well region 18 in the semiconductor substrate 5. Isolation oxide regions and interconnect structures 22 are also defined on the semiconductor substrate 5. An N-type lightly doped drain/source (LDD) region 23, gate insulator region 24, polysilicon gate layer 26, and gate sidewall region 27 are defined by methods known in the art. The polysilicon gate layer 26 may also be referred to as the first polysilicon layer or poly 1 layer.

The capacitor region 20 includes a lower capacitor electrode 30 that contacts the source/drain region 23A through an insulator layer 34. The insulator layer 34 (or dielectric layer) is formed over the polysilicon gate layer 26 and the source/drain region 23, 23A before the fabrication of the lower capacitor electrode 30. An opening is defined over the source/drain region 23A in the insulator layer 34 to connect the source/drain region to the lower capacitor electrode. A capacitor dielectric layer 32 and upper capacitor electrode 33 are also defined in the capacitor region 20. It should be noted that the lower capacitor electrode and upper capacitor electrode may be referred to as the second polysilicon layer and third polysilicon layer, respectively, or poly 2 layer and poly 3 layer, respectively. As line widths become smaller for the higher memory DRAM devices, the mask alignment for defining the opening over the source/drain region 23A becomes more difficult to perform accurately. To prevent the lower capacitor electrode (poly-2) from shorting to the poly-1 gate layer, the opening is often located some distance away from the poly-1 gate layer, typically far enough to accomodate for misalignment inherent in the process. This distance often increases the average cell size of the integrated circuit; therefore an undesirable result.

Figure 1A:
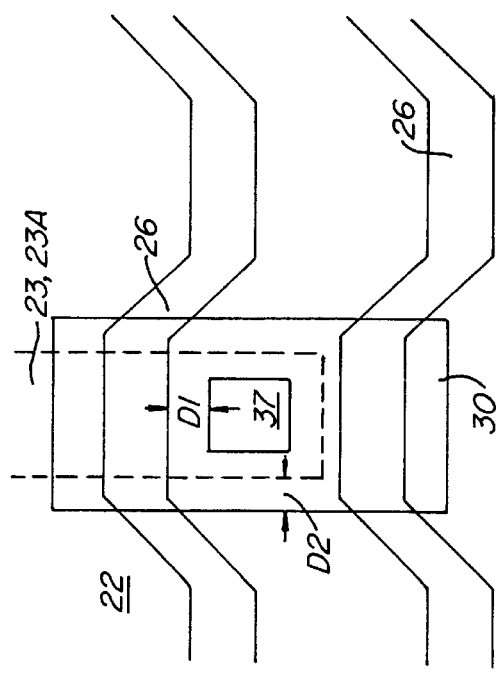
FIG. 1A is a top view of a capacitor region for the device of FIG. 1.

FIG. 1A illustrates a top-view of a portion of the conventional DRAM cell 16 and in particular the capacitor region 20 of FIG. 1. The gate polysilicon layer 26, lower capacitor electrode 30, source/drain region 23, 23A (active region), and a contact region 37 are defined in the field oxide isolation region 22. The contact region 37 is the area where the lower capacitor electrode 30 rests on and in contact with the underlying source/drain region 23A. The dielectric layer 34 (not shown) separates and insulates the lower capacitor electrode 30 from the cell elements such as the gate polysilicon 26 layer and the active region portion outside the contact region 37.

The various elements making up the contact region 37 are aligned, typically during the masking step that forms the opening in the dielectric layer 34. The length of double headed arrow D1 represents the desired spacing between an edge of the contact region 37 and an edge of the gate polysilicon layer 26 to prevent them from contacting each other. The other length represented by the double headed arrow of D2 illustrates the desired overlap of the lower capacitor electrode 30 overlying the active region 23A. As line widths become smaller, it is often difficult to form the opening in the dielectric layer accurately such that the gate polysilicon layer 30 aligns with its source/drain region 23A. This difficulty tends to form capacitors with a misaligned lower electrode which often leads to non-functional DRAM cells and lower wafer yields, therefore increasing the average cost of good dies on the semiconductor wafer.

Prior Art DRAM Fabrication Methods

A simplified prior art DRAM fabrication process may be briefly outlined as follows:

(1) Provide semiconductor substrate.

(2) Grow gate oxide layer.

(3) Deposit gate polysilicon layer (or poly 1 layer) and dope.

(4) Mask 1: Define gate polysilicon layer to form polysilicon gate regions.

(5) Mask 2: Define N-type LDD regions and implant.

(6) Mask 3: Define P-type LDD regions and implant.

(7) Form sidewall spacers on the polysilicon gate regions.

(8) Mask 4: Define cell source/drain regions and implant.

(9) Mask 5: Define N+ type source/drain regions and implant.

(10) Mask 6: Define P+ type source/drain regions and implant.

(11) Deposit inter poly oxide layer.

(12) Mask 7: Define cell contact regions (alignment critical).

(13) Deposit poly 2 layer and dope.

(14) Mask 8: Define poly 2 layer to correspond to a lower capacitor electrode.

(15) Form cell capacitor dielectric.

(16) Deposit poly 3 layer and dope.

(17) Mask 9: Define poly 3 layer to correspond to an upper capacitor electrode.

(18) Deposit dielectric layers.

(19) Sputter aluminum layer.

(20) Mask 10: Pattern aluminum layer.

(22) Deposit surface passivation layers.

(23) Mask 11: Define pad regions with pad mask.

This sequence of fabrication steps requires at least eight masking steps to form the lower capacitor electrode for the DRAM cell. Such masking steps are represented as masks 1 to 8 above. The alignment of mask 7 used to form openings through the interpoly dielectric to the underlying source/drain region is typically difficult, but often necessary to properly align to poly-1 layer. Due to the difficulty in aligning the opening at the desired location, the masking step is often known as a critical masking step.

Present DRAM Embodiments

Figure 2:
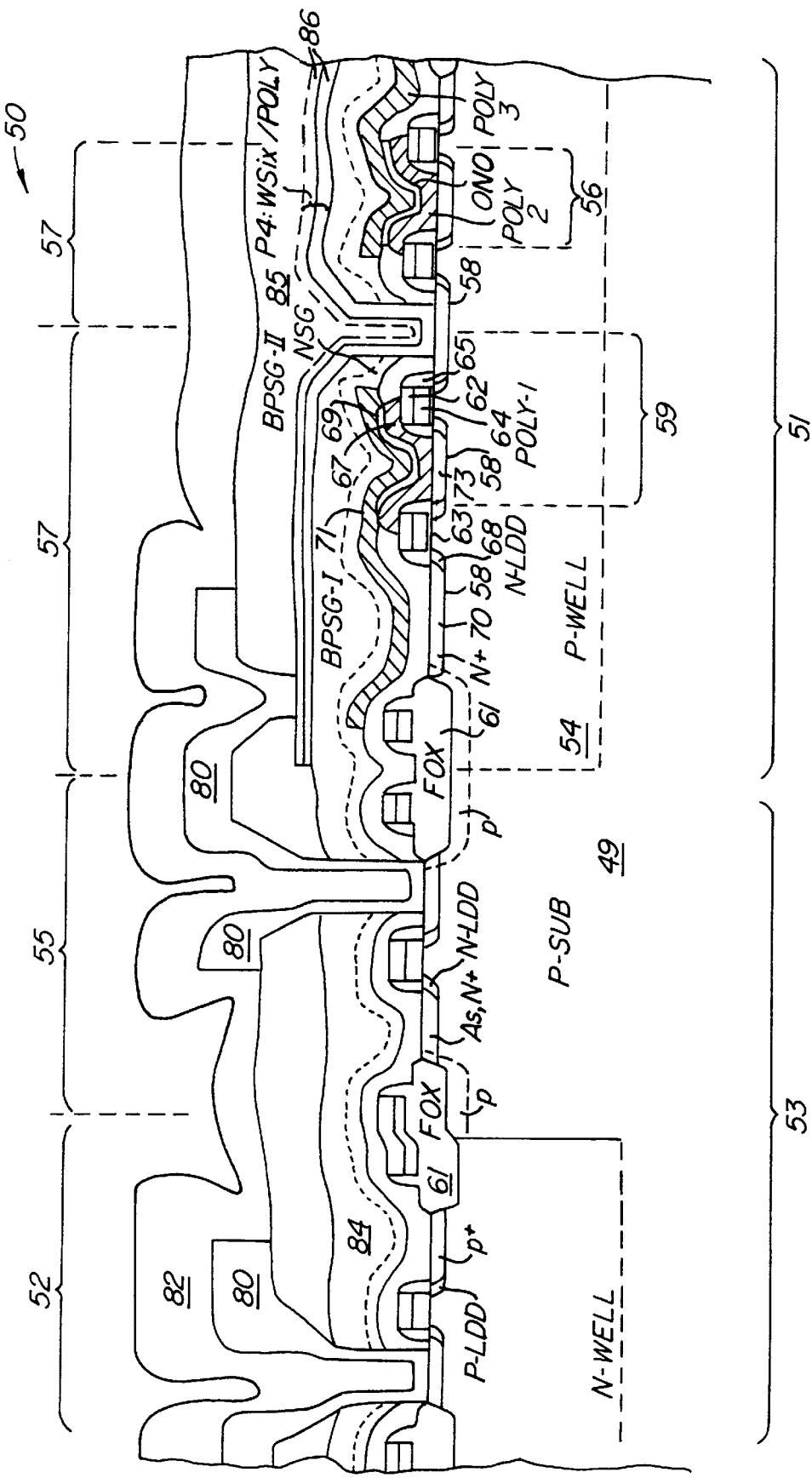
FIG. 2 is a cross-sectional view of an embodiment of the present integrated circuit device.

An embodiment of the present integrated circuit is illustrated by a cross-section of FIG. 2. The present integrated circuit is shown, for example, as a DRAM structure 50 for illustrative purposes which should not limit the scope of the invention as defined by the claims.

The present DRAM integrated circuit 50 includes a core memory region 51 and a peripheral region 53, typically defined as a P-type channel FET 52 and an N-type channel FET 55. In the core memory region 51, DRAM cells 57 each having a DRAM FET 59 and storage cell capacitor 56 are defined in a P-type semiconductor substrate 49. Other cell elements such as metallization 80, surface passivation 82, BPSGI (borophosphosilica glass) 84, BPSGII 85, polysilicide 86, among others are further defined in the DRAM integrated circuit structure.

The FET 59 in the DRAM cell 57 is, for example, an N-type channel device defined in a P-type well region 54. An N-type source/drain region 58, isolation oxide region 61, gate insulator layer region 63, gate polysilicon layer 64, cap oxide layer 62, and gate sidewall region 65 are also defined. The N-type source/drain region includes an N- type LDD region 68 and an N+ type source/drain region 70. Further details in fabricating the DRAM cell 57 according to the present invention are illustrated by FIGS. 3–9.

The DRAM storage cell capacitor 56 includes a lower capacitor electrode 67, capacitor dielectric 69, and upper capacitor electrode 71. The lower capacitor electrode rests on and in contact with the source/drain region 73 without an interpoly dielectric layer. Accordingly, the lower capacitor electrode 67 is fabricated onto the source/drain region 73 without the use of an intermediary masking step, and therefore forms onto its source/drain region through a self-aligned process. This self-aligned process eliminates at least mask 7 of the prior art DRAM fabrication process.

Figure 2A:
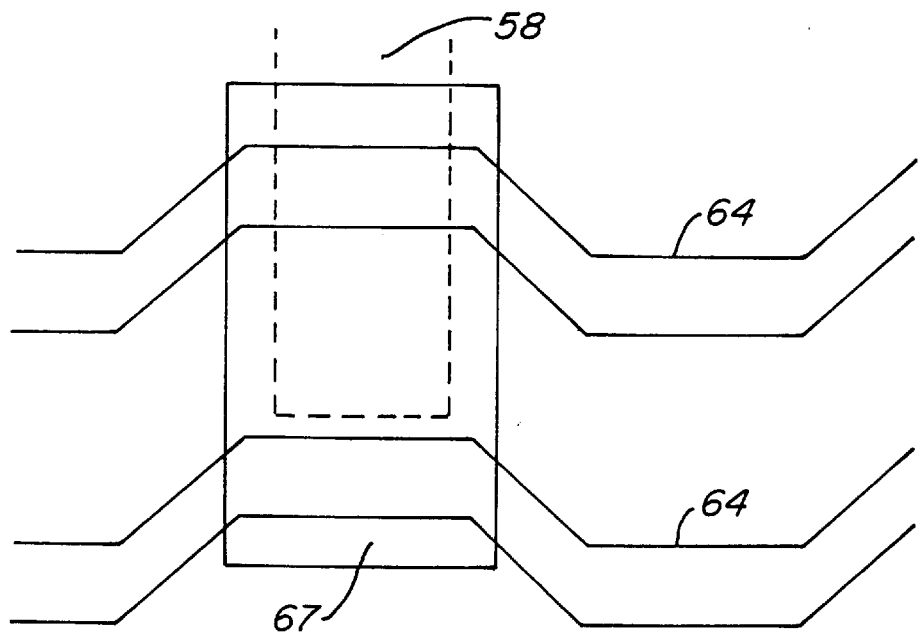
FIG. 2A is a top view of a capacitor region for the present device of FIG. 2.

A top view of a portion of the integrated circuit of FIG. 2 is illustrated in FIG. 2A. The top view includes the gate polysilicon layer 64, lower capacitor electrode 67, and source/drain region 58. Relating the top view of FIG. 2A with Fig. 1A, it should be noted that no contact region exists in FIG. 2A, because an interpoly dielectric layer is not defined between the gate polysilicon layer and lower capacitor electrode. The poly-1 gate layer is often sealed by oxide which isolates poly-1 from poly-2. The oxide allows poly-2 to lay over poly-1 without poly-1 poly-2 shorting problems, and therefore eliminates the critical masking step 7 used in the fabrication of the conventional DRAM integrated circuit.

Present DRAM Fabrication Methods

An embodiment of the present DRAM fabrication method is shown as follows:

(1) Provide semiconductor substrate.

(2) Grow gate oxide layer.

(3) Deposit poly 1 layer (or gate polysilicon layer 1) and dope. Deposit cap oxide layer overlying the poly-1 layer.

(4) Mask 1: Define poly 1 layer to form polysilicon gate regions (with the cap oxide still on top).

(5) Mask 2: Define N-type LDD regions and implant.

(6) Mask 3: Define P-type LDD regions and implant.

(7) Form sidewall spacers on the polysilicon gate regions.

(8) Deposit self-aligned poly 2 layer, preferably, without doping.

(9) Form thin oxide layer.

(10) Mask 4: Define P+ type source/drain regions and implant.

(11) Mask 5: Define N+ type source/drain regions and implant.

(12) Anneal to drive in dopants from poly 2 layer to the cell source/drain regions.

(13) Deposit silicon nitride layer.

(14) Mask 6: Define nitride layer using the thin oxide layer as an etch stop.

(15) Grow oxide layer by decomposing the exposed poly 2 layer and anneal to, preferably, further drive-in dopants.

(16) Strip nitride layer.

(17) Strip about 300 Å of the oxide layer.

(18) Form cell capacitor dielectric.

(19) Deposit poly 3 layer and dope.

(20) Mask 7: Define poly 3 layer to form upper capacitor electrode layer.

(21) Deposit dielectric layers.

(22) Sputter aluminum.

(23) Deposit surface passivation layers.

(24) Mask 8: Define pad regions with pad mask.

FIGS. 3–9 illustrate a method of fabricating the present integrated circuit according to the present invention. The embodiment of FIGS. 3–9 is shown for illustrative purposes only, and therefore should not limit the scope of the invention recited by the claims. Furthermore, the method depicted by the FIGS. 3–9 is not necessarily to scale unless otherwise indicated.

Figure 3:
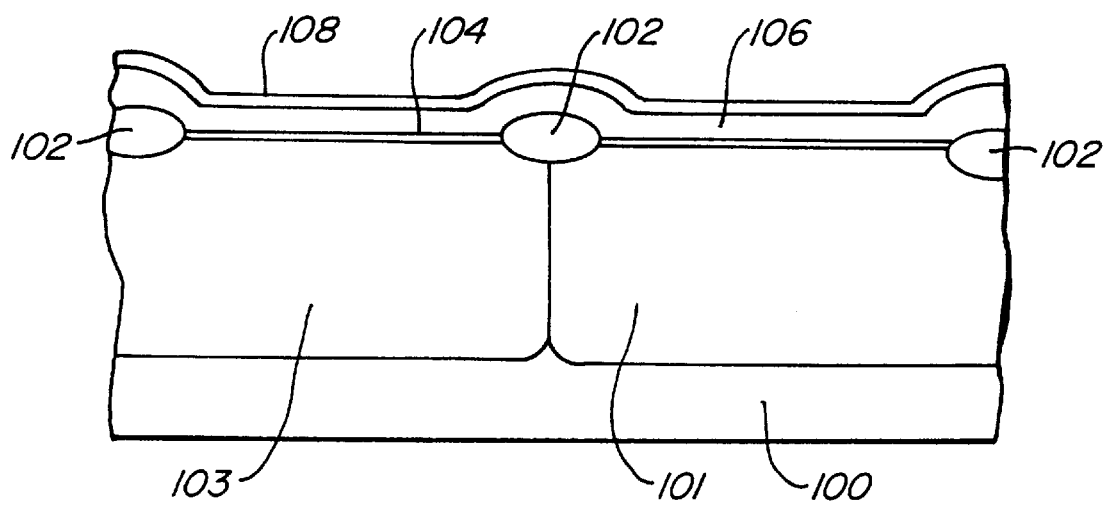
FIGS. 3–9 illustrate a method of fabricating an embodiment of the present integrated circuit device.

FIG. 3 illustrates a field oxide region 102 and gate oxide layer 104 formed over a P-type well region 103 and an N-type well region 101 defined in a P-type semiconductor substrate 100. The field oxide region 102 is fabricated by a known processing technique, such as the localized oxidation of silicon (LOCOS). LOCOS is typically used as a starting point for providing regions on the substrate used for device fabrication. The gate oxide layer 104 is typically thin to promote for the desired switching of the device. A polysilicon layer 106 is formed over the oxide layers 102, 104, and an overlying oxide layer 108 is defined over the polysilicon layer 106. The thickness of the polysilicon layer 106 is likely to be from about 2,000 to 3,500 Å, and preferably at about 2,750 Å. The polysilicon layer 106 is also typically doped with an N+ type impurity at a concentration of from about 5E15 to 3E16 atoms/cm$^2$, and preferably at about 1E16 atoms/cm$^2$. The overlying oxide layer 108 includes a thickness from about 3,000 to 8,000 Å, and preferably at about 4,000 Å. Of course, the various concentrations and thicknesses will depend on the particular application.

Figure 4:
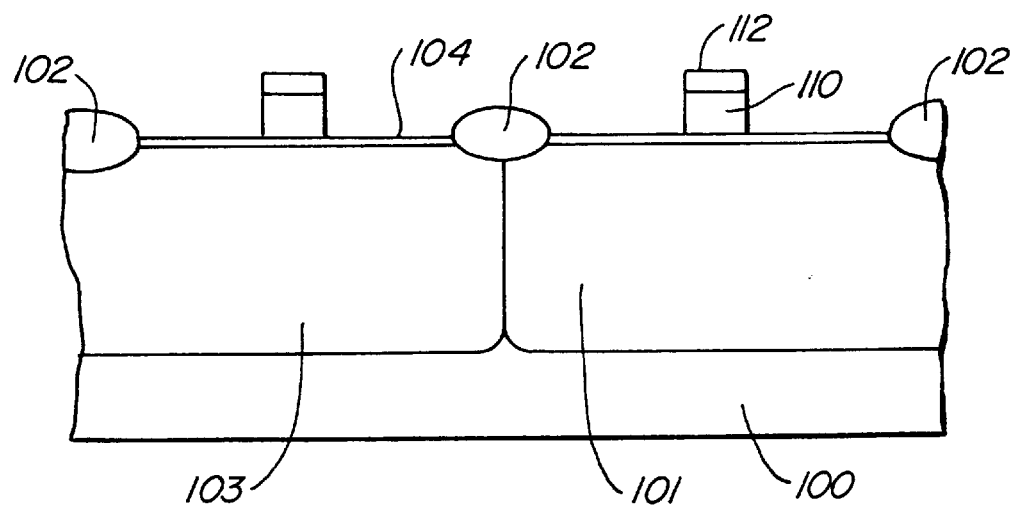

The structure depicted by FIG. 3 is masked, exposed, and etched to form polysilicon gate regions as illustrated by FIG. 4. A polysilicon gate layer 110 defined over the thin gate oxide layer 104 is formed by typical lithography techniques. The polysilicon gate layer 110 also includes a cap oxide layer 112.

Figure 5:
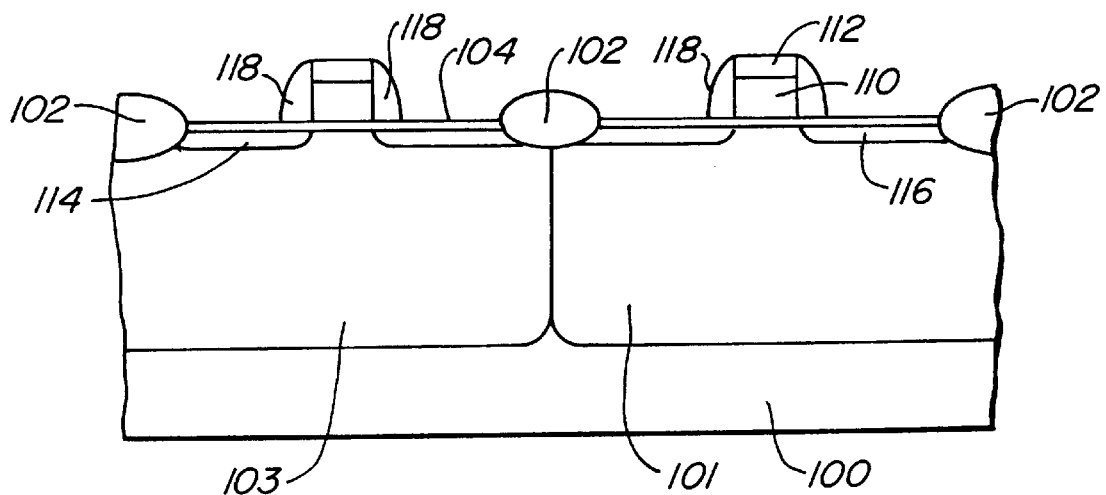

Lightly doped drain regions (LDDs) are defined onto the structure of FIG. 4 by a methods such as masking, implanting, and stripping. An N-type LDD region 114 and a P-type LDD region 116 defined in the respective well regions are illustrated in FIG. 5. The N-type LDD region 114 is likely to be implanted with impurities such as phosphorus and the like at concentrations from about 1E13 to 5E13 atoms/cm$^2$, and preferably at about 3E13 atoms/cm$^2$. The junction depth of the N-type implant is from about 1,000 to 3,000 Å, and preferably at about 2,000 Å. The P-type LDD region 116 includes impurities such as boron and the like at concentrations from about 1E13 to 5E13 atoms/cm$^2$, and preferably at about 3E13 atoms/cm$^2$. The junction depth of the P-type implant is from about 1,500 to 3,500 Å, and preferably at about 2,500 Å. Of course, the various concentrations and depths will depend upon the particular application.

Impurities for the LDD regions are typically implanted into the thin layer of oxide overlying the substrate and then diffused into the substrate to form the LDD regions. The thin layer of oxide acts as a "screen" and often protects the underlying single crystal substrate from excessive damage caused by implanting. A subsequent annealing step allows for the diffusion of impurities from the thin oxide layer into the well regions to form the LDD regions for each MOS device.

The method further provides forming sidewall spacers 118 on the edges of the gate polysilicon layer 110. The sidewall spacers 118 are typically formed by the steps of depositing a layer of dielectric material, densifying such layer, and removing horizontal surfaces of such layer. The layer of dielectric material such as silicon dioxide, silicon nitride, combinations thereof, and the like is formed over the surface of the partially completed device structure of FIG. 4. The step of densifying such dielectric material seals the polysilicon gate layer 110 from an overlying layer, often a conductive layer such as polysilicon, and the like.

An anisotropic etching step is performed on the densified dielectric layer to form the sidewall spacer 118. The anisotropic etching step substantially removes the horizontal surfaces of the dielectric material and leaves sidewall spacers 118. Either reactive ion etching, plasma etching, or the like is often used to provide the desired anisotropic characteristics. Preferably, the dielectric material is cleared-off from the source and drain regions, typically by over-etching the dielectric material to expose top surfaces of the N-type and P-type LDD regions. The process in use to clean off the top surfaces can be any suitable technique such as a hydrofluoric acid dip (about 1% for about 20 seconds), or the like. Good contact now exists between the source/drain region and an overlying conductive layer.

Figure 6:
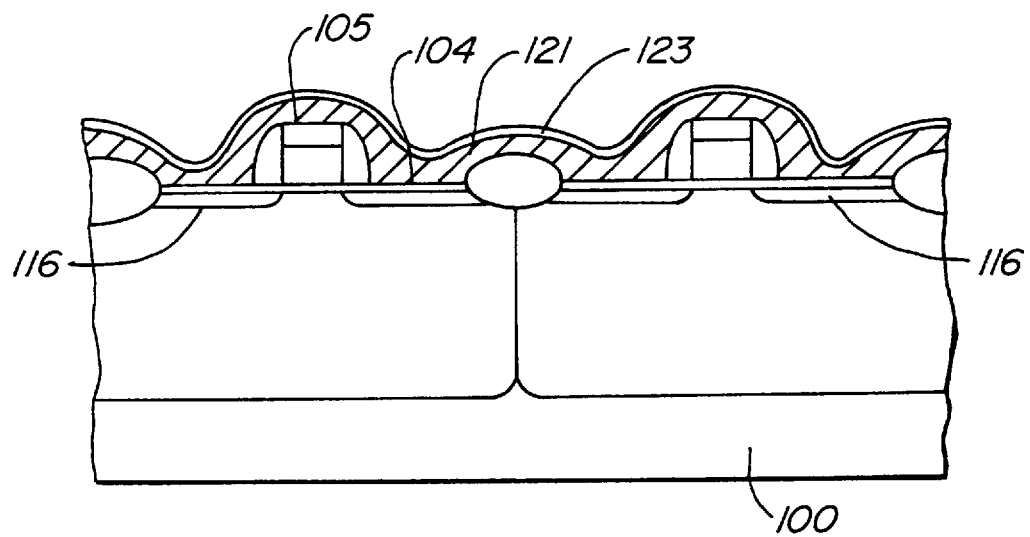

The method then provides depositing a polysilicon layer 121 overlying a top surface of the FIG. 5 structure as illustrated by FIG. 6. The polysilicon layer 121 typically has a thickness ranging from about 700 to 1,300 Å, and preferably at about 1,000 Å. A thin layer of oxide 123 is then formed overlying the polysilicon layer 121. The thin oxide layer 123 includes a thickness ranging from about 200 to 300 Å, and preferably at about 250 Å. Of course, the thickness of such thin oxide layer will depend on the particular application.

The polysilicon layer 121 is masked, exposed, and implanted to form the N+ type source/drain regions 124. N+ type impurities such as phosphorus, arsenic, or the like are introduced into polysilicon layer 121 through exposed regions of mask by a step of implanting or the like. The phosphorus impurities include a concentration ranging from about 5E15 to 1E16 atoms/cm$^2$, and preferably at about 8E15 atoms/cm$^2$. Alternatively, arsenic impurities may include a concentration ranging from about 5E15 to 1E16 atoms/cm$^2$, and preferably at about 8E15 atoms/cm$^2$. It should be noted the N+ type impurities will be diffused from the polysilicon layer 121 into the source/drain regions during a subsequent anneal or dopant drive-in step. The junction depth of the N+ type source/drain regions is from about 1,000 to 3,000 Å, and preferably about 2,000 Å. The impurity type and concentrations often depend on the particular application. A step of photoresist (PR) strip then removes the N+type implant mask layer from the polysilicon layer 121.

P+ type source/drain regions 126 are also formed by steps of masking, exposing, and implanting the polysilicon layer 121. The P+ type impurities such as boron or the like include a concentration ranging from about 5E15 to 1E16 atoms/cm$^2$, and preferably at about 8E15 atoms/cm$^2$. Similar to the N+ type implant, a subsequent anneal or drive-in step diffuses the P+ type impurity from polysilicon layer 121 into the desired source/drain regions. The junction depth of the P+ type impurities is from about 1,500 to 2,500 Å, and preferably about 2,000 Å.

Figure 7:
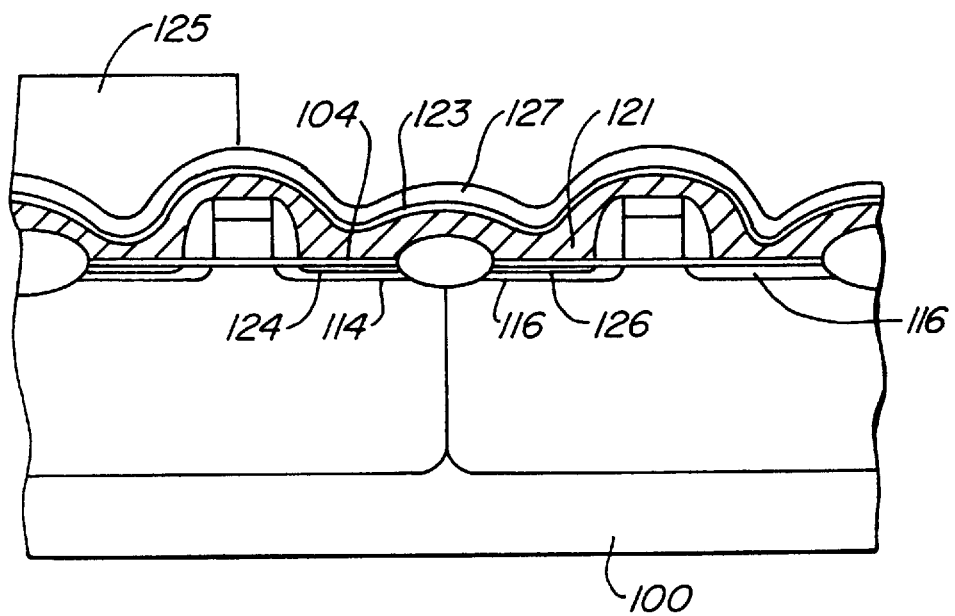

Both the N+ type and P+ type impurities diffuse from the polysilicon layer 121 into their respective source/drain regions during the subsequent annealing step, typically the dopant drive-in step. The resulting structure is illustrated by FIG. 7. The same subsequent annealing step is also likely to repair defects in the single crystal silicon which may have been caused by any of the previous implants. It should be noted that since the N+ type and P+type impurities are diffused into the source/drain regions, rather than implanted directly, less damage often occurs to the single crystalline silicon in these regions. Less damage to the crystalline silicon is likely to improve characteristics such as junction quality, leakage, among others, for the resulting DRAM integrated circuit.

A silicon nitride layer 127 is then deposited overlying the oxide layer 123 and polysilicon layer 121. The nitride layer 127 includes a thickness ranging from about 0.1 to 0.16 μm, and preferably at about 0.13 μm. The nitride layer is then defined by a photoresist mask 125 to form exposed portions of the nitride layer 132 as illustrated in FIG. 7.

Figure 8:
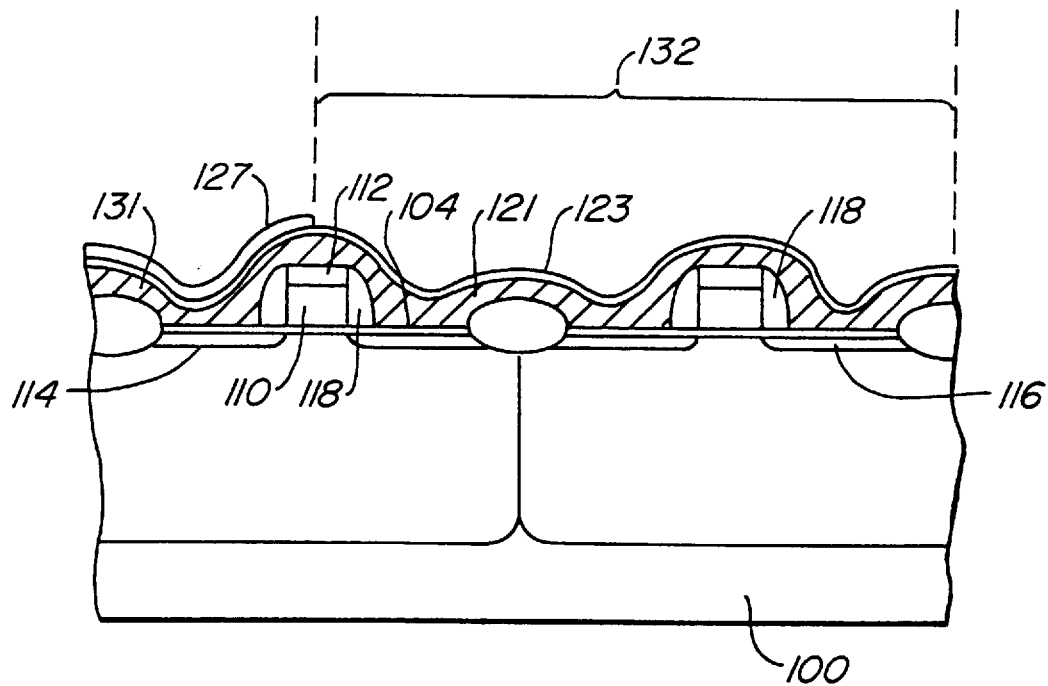

An etching step removes the exposed portions of the nitride layer 132 to define a remaining nitride region over a portion 131 of the polysilicon layer as illustrated in FIG. 8. In etching the nitride layer, a wet etchant such as hot phosphoric acid or the like is often used. The oxide layer 123 which has a thickness from about 0.015 to 0.035 μm, and preferably at about 0.025 μm can act as an etch stop from the nitride etchant. The photoresist mask 125 then undergoes a strip process and is removed. It should be noted that the sidewall spacer 118 and cap oxide layer 112 effectively isolates and seals the gate polysilicon layer 110 from the polysilicon layer 121.

Figure 9:
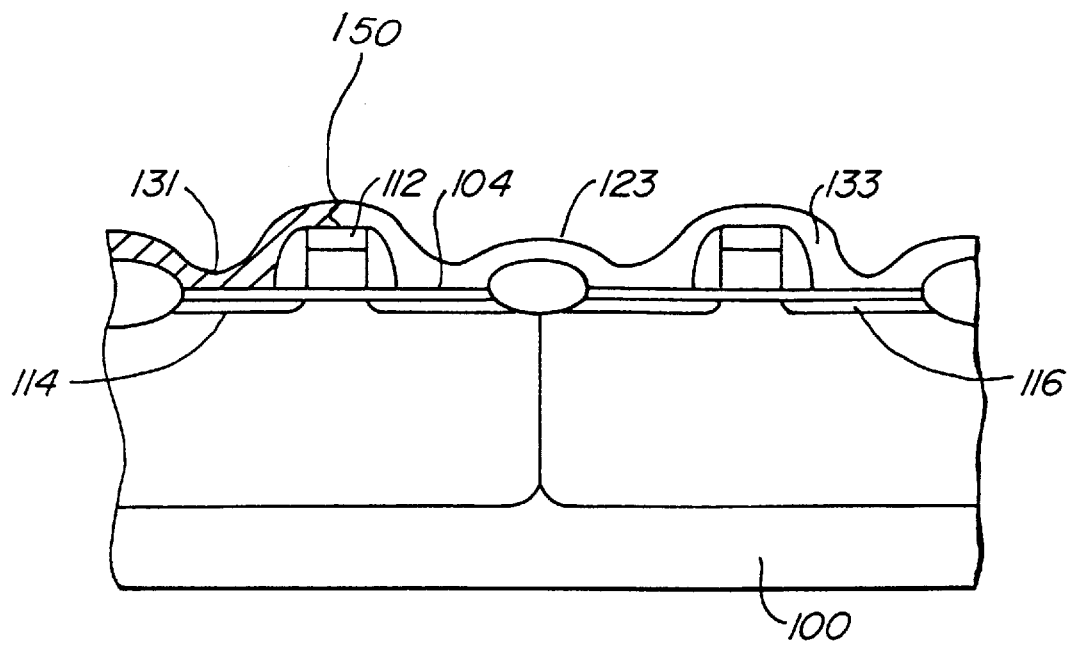

A layer of oxide is then thermally grown through an annealing step (oxidation) by decomposing the exposed portion 132 of the polysilicon layer 121 as shown in FIG. 8. The annealing step essentially decomposes the polysilicon layer 121 into silicon dioxide, typically to a thickness ranging from about 2,000 to 3,000 Å, and preferably at about 2,500 Å. It should be noted that this step also drives in dopants from the polysilicon layer to their respective source/drain regions. The nitride layer overlying the polysilicon layer portion 131 retards its oxidation during the oxidation step, and the exposed portion 132 of polysilicon undergoes conversion into the silicon dioxide layer 133 at a much faster rate. The remaining nitride layer 127 is then removed with, for example, a hot phosphoric acid solution or the like. Preferably, about 350 Å of the oxide layer 123 is also removed before the wet etching step that removes the nitride layer. The resulting structure defined by the silicon dioxide layer 133 adjacent to the polysilicon layer 131 (or lower capacitor electrode) as illustrated by FIG. 9.

The present lower capacitor structure is formed by the different rates in converting polysilicon into silicon dioxide between the exposed portion 132 of the polysilicon and the nitride-covered polysilicon portion 131. The different rates of polysilicon conversion is likely to occur for reasons similar to that of the LOCOS process. A resulting identifiable "bird's beak like" structure 150 is shown in FIG. 9. This structure and the different materials (polysilicon and oxide) adjacent to each other provide for the easy identification of the resulting device according the present invention.

Subsequent processing steps may further include forming a dielectric layer, such as an oxide layer or the like, overlying the polysilicon layer portion 131 to define the capacitor dielectric layer. The thickness of such dielectric layer, such as the ONO structure, ranges from about 50 to 120 Å, and preferably about 75 Å. Of course, the thickness of the dielectric layer depends on the particular application.

The completed capacitor structure includes another polysilicon layer formed overlying the dielectric layer. The polysilicon layer is typically doped with N+ type impurities having a concentration ranging from about 5E15 to 2E16 atoms/cm$^2$, and preferably at about 8E15 atoms/cm$^2$. The polysilicon layer is then defined by a masking and etching step to form, for example, an upper electrode of a capacitor. Of course, the completed device further includes at least an insulating dielectric layer, metallization for interconnects, and surface passivation.

While the above is a full description of the specific embodiments, various modifications, alternative constructions and equivalents may be used. For example, while the description above is in terms of a DRAM integrated circuit structure, it would be possible to implement the present invention with a SRAM, or the like. Therefore, the above description and illustrations should not be taken as limiting the scope of the present invention which is defined by the appended claims.

What is claimed is:

1. A semiconductor device comprising:

a semiconductor substrate having a first region and a second region;

a first polysilicon layer overlying said first region, said first polysilicon layer including an edge at an intersection of said first region and said second region;

a first oxide layer overlying said first polysilicon layer;

a second polysilicon layer overlying said second region and a portion of said first oxide layer, said second polysilicon layer at least partially in contact with said portion of said first oxide layer; and a second oxide layer overlying another portion of said first oxide layer and intersecting said second polysilicon layer over said first region, said second oxide layer intersecting said second polysilicon layer to form a bird's beak-shaped intersection.

2. The device of claim 1 further comprising a dielectric layer overlying said second polysilicon layer.

3. The device of claim 2 wherein said dielectric layer is a thin oxide layer.

4. The device of claim 2 further comprising a third polysilicon layer overlying said dielectric layer.

5. The device of claim 1 wherein said first oxide layer comprises:

The device of claim 1 wherein said first oxide layer; and a sidewall spacer on said first polysilicon layer edge.

6. The device of claim 1 wherein said first polysilicon layer is doped.

7. The device of claim 1 wherein said second polysilicon layer is doped.

8. The device of claim 4 wherein said second polysilicon layer, said dielectric layer, and said third polysilicon layer define a capacitor for a DRAM integrated circuit structure.

9. The device of claim 5 wherein said cap oxide layer and sidewall spacer isolates said first polysilicon layer from said second polysilicon layer.

10. A semiconductor device comprising:

a semiconductor substrate having a first region and a second region;

a first polysilicon layer overlying said first region, said first polysilicon layer including an edge at an intersection of said first region and said second region;

a first oxide layer overlying said first polysilicon layer;

a second polysilicon layer overlying said second region and a portion of said first oxide layer; and a second oxide layer overlying another portion of said first oxide layer and intersecting said second polysilicon layer over said first region, said oxide layer intersecting said second polysilicon layer to form a bird's beak-shaped intersection thereof; wherein said second oxide layer is formed from the conversion of polysilicon.

11. A semiconductor device comprising:

a semiconductor substrate having a first region and a second region;

a first polysilicon layer overlying said first region, said first polysilicon layer including an edge at an intersection of said first region and said second region;

a first oxide layer overlying said first polysilicon layer;

a second polysilicon layer overlying said second region and a portion of said first oxide layer, said first oxide layer isolating said first polysilicon layer from said second polysilicon layer; and a second oxide layer overlying another portion of said first oxide layer and intersecting said second polysilicon layer over said first region, said second oxide layer intersecting said second polysilicon layer to form a bird's beak-shaped intersection.

12. The device of claim 11 wherein said first oxide layer comprises:

a cap oxide layer overlying said first polysilicon layer; and a sidewall spacer on said first polysilicon layer edge.

* * * * *